United States Patent
Khaw et al.

(10) Patent No.: US 7,332,823 B2
(45) Date of Patent: Feb. 19, 2008

(54) PROVIDING A METAL LAYER IN A SEMICONDUCTOR PACKAGE

(75) Inventors: Lee Peng Khaw, Kedah (MY); Chee Koang Chen, Penang (MY); Wooi Aun Tan, Penang (MY); Tze Yang Hin, Penang (MY)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 11/300,720

(22) Filed: Dec. 15, 2005

(65) Prior Publication Data

US 2007/0138656 A1 Jun. 21, 2007

(51) Int. Cl.
*H01L 23/28* (2006.01)
(52) U.S. Cl. .............. 257/787; 257/704; 257/719; 257/778; 257/E23.104
(58) Field of Classification Search ............ 257/787
See application file for complete search history.

(56) References Cited

U.S. PATENT DOCUMENTS 6,870,736 B2   3/2005  Lee et al. ............ 361/704
6,927,097 B2   8/2005  Dunlap ................ 438/118
7,026,711 B2 * 4/2006  Lee et al. ............ 257/706

OTHER PUBLICATIONS

U.S. Appl. No. 11/230,772, filed Sep. 20, 2005, entitled "Electronic Assembly That Includes Pads Having A Bowl Shaped Upper Section" by Chee Koang Chen, Chi Chyang Siah and Teik Hong Chuan.

"Bumpless Build-up Layer Packaging Technology" Intel Virtual Press Kit. http://www.intel.com/pressroom/archive/backgrnd/20011008tech_bkgrd.htm. Oct. 8, 2001.

* cited by examiner

*Primary Examiner*—Tu-Tu Ho
(74) *Attorney, Agent, or Firm*—Trop, Pruner & Hu, P.C.

(57) ABSTRACT

In one embodiment, the present invention includes a semiconductor package having a substrate, a semiconductor die with a first surface opposing the substrate and a second surface, a metal layer formed on the second surface of the semiconductor die, and a mold layer formed on the substrate. In some embodiments, the mold layer is substantially coplanar with the metal layer to improve package performance. Other embodiments are described and claimed.

13 Claims, 3 Drawing Sheets

100

```
┌─────────────────────────┐
│  Form Mold Layer Over   │ ─ 110
│    Exposed Substrate    │
└───────────┬─────────────┘
            ▼
┌─────────────────────────┐
│  Form Metal Layer Over  │ ─ 120
│   Semiconductor Die     │
│  Substantially Coplanar │
│     with Mold Layer     │
└───────────┬─────────────┘
            ▼
┌─────────────────────────┐
│    Affix Cover To       │ ─ 130
│      Substrate          │
└─────────────────────────┘
```

FIG. 5

PROVIDING A METAL LAYER IN A SEMICONDUCTOR PACKAGE

BACKGROUND

Embodiments of the present invention relate to semiconductors, and more particularly to semiconductor packaging technology.

Today's integrated circuits (ICs) are manufactured with increasingly higher performance, reduced costs, and increased miniaturization of components and devices. Accordingly, packaging for such ICs is also subject to ongoing shrinkage of form factors. Some ICs such as processors, controllers, logic devices, memory devices and the like may be housed in a package including a substrate having internal electrical connections to the semiconductor die, along with other components. The package further includes external electrical connections to enable the package to be electrically connected to, for example, a circuit board such as a motherboard or the like, either directly or indirectly.

As semiconductor devices and corresponding semiconductor packages continue to shrink, many issues arise. For example, when the thickness of a substrate of a semiconductor package shrinks, substrate coplanarity/warpage challenges can exist during assembly operations. To attempt to overcome such problems, a package can be molded to improve its stiffness. However, in applying a molding to such a package, concern must be taken to avoid molding over a semiconductor die within the package. That is, an exposed-die mold configuration is typically used in which the mold layer and the exposed portion of the semiconductor die (typically a backside) are substantially coplanar. This coplanarity allows the die to be exposed, as the die, which can include various semiconductor devices such as processors, functional units, memories and the like, radiates significant heat during operation. An exposed die improves heat dissipation performance, as a heat sink or other thermal dissipation mechanism can be directly coupled to the die. This direct contact allows heat from the die to be effectively thermally coupled to the thermal dissipation mechanism.

However, an exposed-die molded package in packaging having a small form factor (e.g., thickness) fails to meet planarity limitations and thus still suffers from warpage problems. Such warpage issues are exacerbated during stress testing, such that mold-to-substrate delamination occurs after such stressing due to excessive package warpage.

Accordingly, a need exists for improved semiconductor packaging techniques.

BRIEF DESCRIPTION OF THE DRAWINGS

FIG. 5 is a flow diagram of a method in accordance with one embodiment of the present invention.

DETAILED DESCRIPTION

In various embodiments, a metal layer may be formed on one or more semiconductor die located in a semiconductor package. In this manner, improved thermal performance for the die and coplanarity of the resulting package may be achieved. Different manners of forming such a metal layer may be effected in different embodiments of the present invention.

Such a metal layer may be particularly suitable for packaging technologies in which the package has a relatively thin form factor. For example, in some embodiments a substrate of a package may have a thickness of under approximately 1 millimeter (mm), and in some embodiments the substrate may have a thickness of approximately 500 microns (um), although the scope of the present invention is not so limited. In such implementations, package warpage issues can be a concern. To alleviate coplanarity issues, a metal layer may be formed over the die to aid in thermal performance, and a mold layer may be formed over the exposed portion of the substrate to improve coplanarity.

While embodiments may be used in different packaging technologies, in one embodiment a direct layer and lamination (DLL3) substrate may be used. Such a substrate may have improved electrical performance and cost effectiveness. However, the substrate may be relatively thin, leading to warpage issues. Accordingly, such a package may be stiffened in accordance with an embodiment of the present invention to improve coplanarity.

Figure 1:
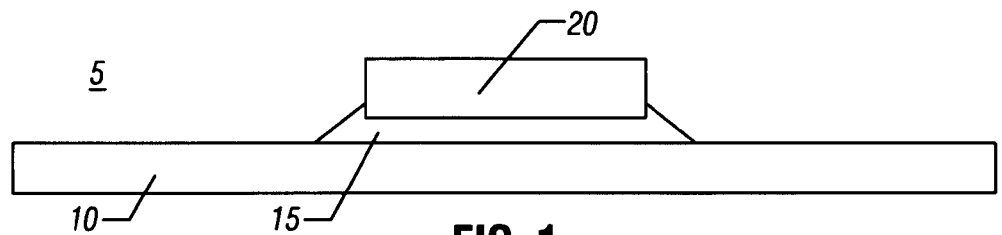
FIG. 1 is a cross-sectional view of a partially formed semiconductor package in accordance with one embodiment of the present invention.

Referring now to FIG. 1, shown is a cross-sectional view of a partially formed semiconductor package in accordance with one embodiment of the present invention. As shown in FIG. 1, package 5 includes a substrate 10 having a semiconductor die 20 affixed thereto via an underfill layer 15. While not shown to scale in FIG. 1, it is to be understood that in various implementations, substrate 10 may have a limited thickness (e.g., approximately 500 um). Accordingly, package 5, when further processed may suffer from warpage issues.

To overcome warpage problems, a mold layer may be formed. Different manners of forming a mold layer may be implemented in various embodiments. For example, in some embodiments a mold layer may be formed across the entirety of a substrate, including over a semiconductor die thereon. Then, the mold layer may be patterned to expose at least a substantial portion of the semiconductor die. In other implementations, the mold compound may be placed on either side of the semiconductor die. After applying the mold layer, it may be thermally or otherwise processed to cure the mold. The mold compound may be any desired mold material such as an epoxy mold with a silica filler, for example.

Figure 2:
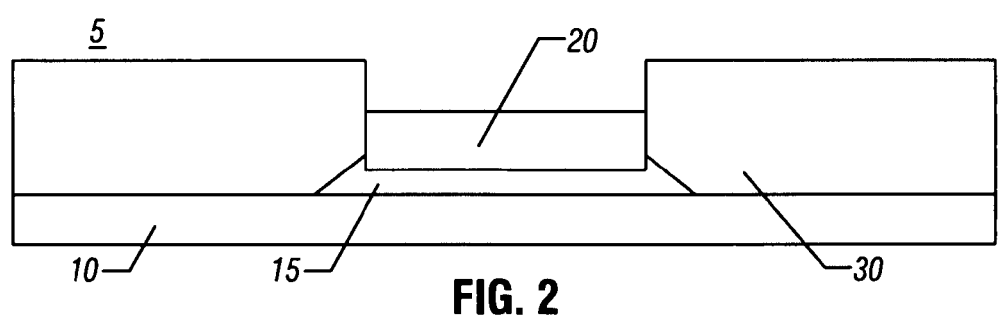
FIG. 2 is a cross-sectional view of a next step in formation of a semiconductor package in accordance with an embodiment of the present invention.

Accordingly, to improve coplanarity a mold compound may be applied to substrate 10. Referring now to FIG. 2, shown is a cross-sectional view of a next step in formation of a semiconductor package in accordance with an embodiment of the present invention. As shown in FIG. 2, a mold layer 30 is present. Mold layer 30 may be an over-molded configuration. That is, mold layer 30 has a thickness such that it extends above the top surface of semiconductor die 20 (which may be a back surface of the die). Note that usage of the terms "top" or "above" is with reference to the orientation of the partially-formed package shown in the Figures, and it is to be understood that these terms apply equally when the package is in another orientation. In this overmolded configuration, poor thermal performance may result if package 5 as configured in FIG. 2 is encapsulated and placed into a system.

Figure 3:
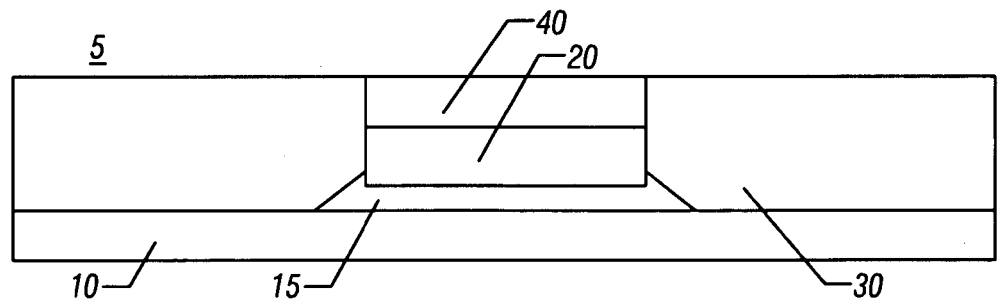
FIG. 3 is a cross-sectional view of a semiconductor package according to a next step in the fabrication of a package in accordance with an embodiment of the present invention.

Accordingly, a metal layer may be formed above semiconductor die 20 so that coplanarity may be improved, as well as maintaining and even improving thermal performance. Thus referring now to FIG. 3, shown is a cross-sectional view of a semiconductor package according to a next step in the fabrication of a package in accordance with an embodiment of the present invention. As shown in FIG. 3, package 5 includes a metal layer 40 formed over semiconductor die 20. As shown, the top of metal layer 40 may be substantially coplanar with the top of mold layer 30. In this way, improved thermal performance and coplanarity may result. In other implementations, metal layer 40 may extend above the top of mold layer 30.

Metal layer 40 may be formed in various manners. For example, in some implementations an electroless or an electrolytic process, or a combination thereof, may be performed. For example, a seed layer of metal may be formed on die 20, e.g., via sputtering. Then a buildup layer may be formed over the seed layer, e.g., via electroplating. However, other manners of forming metal layer 40 may be implemented. In different embodiments, different choices of metals may be used for metal layer 40. For example, in some embodiments a copper (Cu) layer may be used, while in other embodiments nickel (Ni), titanium (Ti), gold (Au), or alloys thereof may be used.

Note that in different embodiments the thickness of various layers, including the substrate and semiconductor die may vary. However, in some embodiments, mold layer 30 may have an aspect ratio of between approximately 2 and 10 with respect to substrate 10. Accordingly, this relatively thicker mold layer may provide desired stiffness to a completed semiconductor package. Further, metal layer 40 may have an aspect ratio of between approximately 0.5 and 1.0 with respect to semiconductor die 20.

Upon completion of mold and metal layers, additional steps may be formed to complete a semiconductor package. For example, in some embodiments an encapsulant or a thermal cover may be formed above mold layer 30 and metal layer 40. In one embodiment, a thermal interface material (TIM) may be applied at least to metal layer 40 prior to attachment of a thermal cover.

Figure 4:
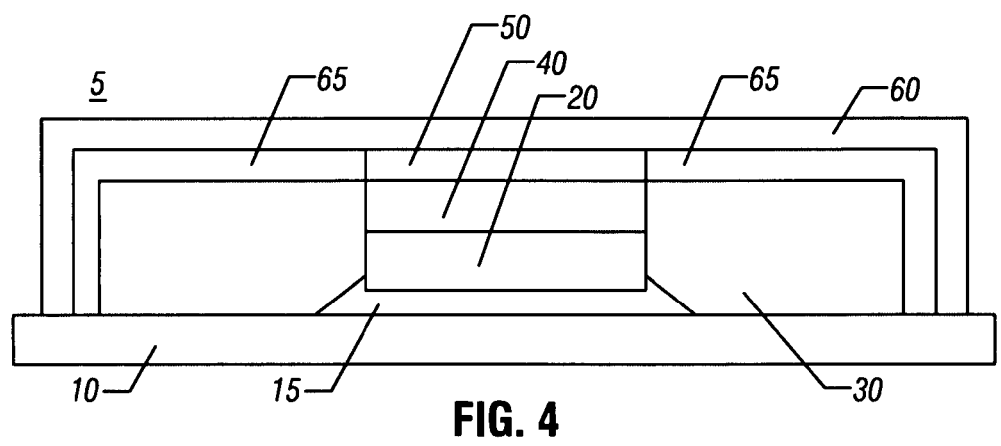
FIG. 4 is a cross-sectional view of a semiconductor package according to a next step in the fabrication of a package in accordance with an embodiment of the present invention.

Referring now to FIG. 4, shown is a cross-sectional view of a semiconductor package according to a next step in the fabrication of the package in accordance with an embodiment of the present invention. As shown in FIG. 4, package 5 is shown to include a thermal cover 60 (e.g., an integrated heat spreader (IHS)). In some embodiments, a TIM layer 50 may be applied to at least metal layer 40. Then thermal cover 60 may be placed over the package and sealed to, e.g., substrate 10, leaving a space 65. Additional curing or other thermo-mechanical steps may be performed to obtain a completed semiconductor package. However, in other embodiments different manners of completing a semiconductor package may be realized.

Referring now to FIG. 5, shown is a flow diagram of a method in accordance with one embodiment of the present invention. As shown in FIG. 5, method 100 may be used to form a semiconductor package in accordance with an embodiment of the present invention. Method 100 may begin by forming a mold layer over exposed portions of a substrate (block 110). That is, the mold layer may be formed over at least substantial portions of the substrate that do not support a semiconductor die. Furthermore, a periphery of the substrate may remain unmolded, so that a cover later may be attached thereto.

Next, a metal layer may be formed over the semiconductor die (block 120). This metal layer, which may be formed of different metals in various embodiments, may be formed in substantial coplanarity with the mold layer via any desired process. Finally, a completed semiconductor package may be realized by affixing a cover to the substrate (block 130). For example, an IHS may be attached, e.g., at the periphery of the substrate. Furthermore, a TIM may be adapted between the metal layer and/or the mold layer and the cover to improve thermal performance. While described with this particular implementation in the embodiment of FIG. 5, it is to be understood that the scope of the present invention is not so limited.

Figure 6:
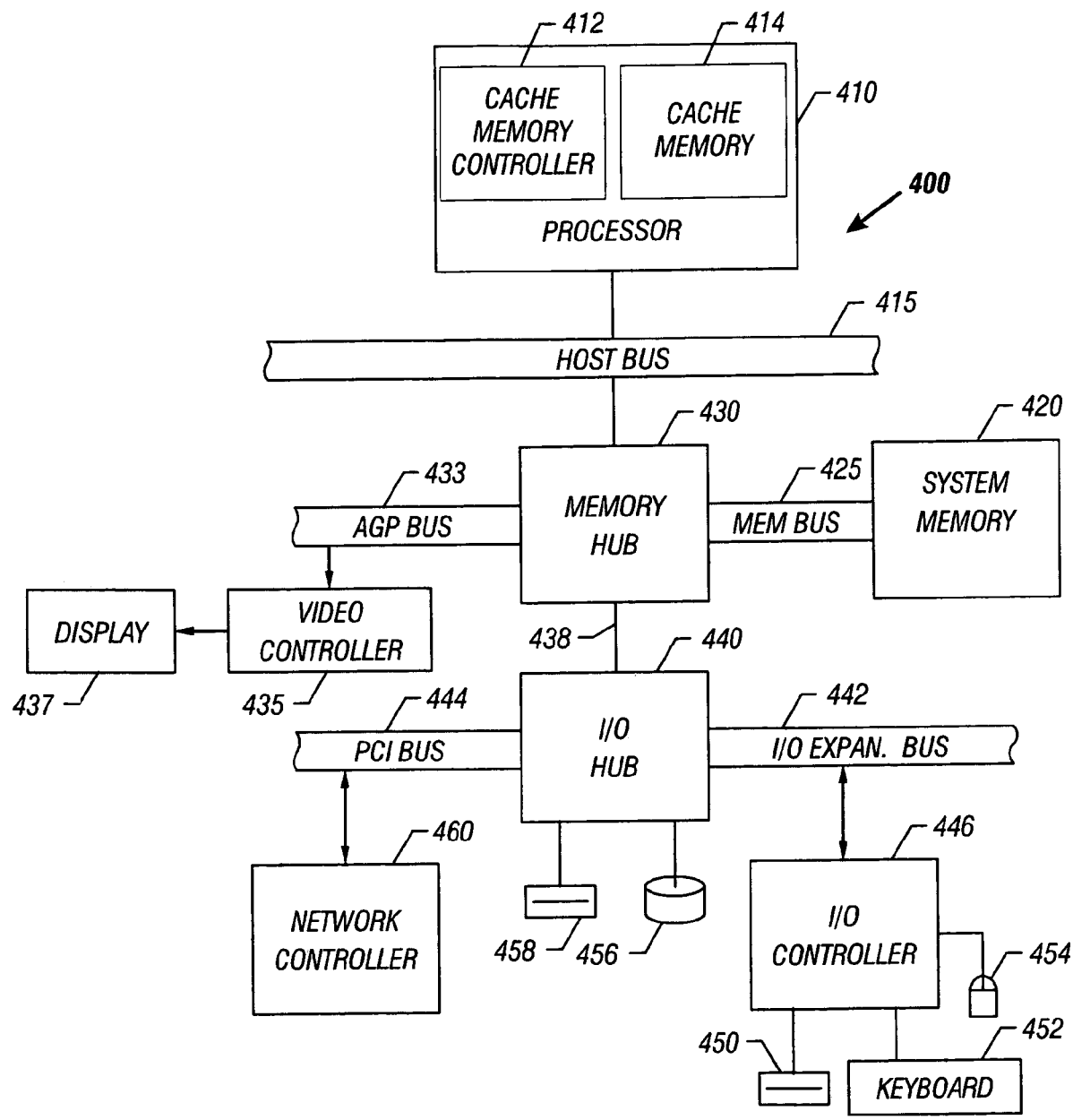
FIG. 6 is a block diagram of a computer system in which embodiments of the invention may be used.

Semiconductor packages in accordance with an embodiment of the present invention may be used in various systems. FIG. 6 is a block diagram of a computer system 400 in which embodiments of the invention may be used. As used herein, the term "computer system" may refer to any type of processor-based system, such as a notebook computer, a server computer, a laptop computer, or the like.

Now referring to FIG. 6, in one embodiment, computer system 400 includes a processor 410, which may include a general-purpose or special-purpose processor such as a microprocessor, microcontroller, a programmable gate array (PGA), and the like. Processor 410 may include a cache memory controller 412 and a cache memory 414. Processor 410 may be housed in a package in accordance with an embodiment of the present invention and coupled, e.g., via a socket, to a circuit board of the system such as a motherboard which may support some or all of the components shown in FIG. 6. Processor 410 may be coupled over a host bus 415 to a memory hub 430 in one embodiment, which may be coupled to a system memory 420 (e.g., a dynamic RAM) via a memory bus 425. Memory hub 430 may also be coupled over an Advanced Graphics Port (AGP) bus 433 to a video controller 435, which may be coupled to a display 437.

Memory hub 430 may also be coupled (via a hub link 438) to an input/output (I/O) hub 440 that is coupled to an input/output (I/O) expansion bus 442 and a Peripheral Component Interconnect (PCI) bus 444, as defined by the PCI Local Bus Specification, Production Version, Revision 2.1 dated June 1995. I/O expansion bus 442 may be coupled to an I/O controller 446 that controls access to one or more I/O devices. As shown in FIG. 6, these devices may include in one embodiment storage devices, such as a floppy disk drive 450 and input devices, such as a keyboard 452 and a mouse 454. I/O hub 440 may also be coupled to, for example, a hard disk drive 456 and a compact disc (CD) drive 458, as shown in FIG. 6. It is to be understood that other storage media may also be included in the system. PCI bus 444 may also be coupled to various components including, for example, a network controller 460 that is coupled to a network port (not shown). Additional devices may be coupled to the I/O expansion bus 442 and the PCI bus 444.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor package comprising:
    a substrate;

at least one semiconductor die having a first surface opposing the substrate and a second surface;

an underfill layer coupled between the at least one semiconductor die and the substrate;

a metal layer formed on the second surface of the at least one semiconductor die; and a mold layer formed on the substrate, wherein a top of the mold layer has a thickness such that the mold layer extends above the second surface of the at least one semiconductor die and is substantially coplanar with a top of the metal layer, to reduce warpage of the semiconductor package.

2. The semiconductor package of claim 1, further comprising a thermal heat spreader affixed to the substrate and in contact with the metal layer to dissipate heat from the at least one semiconductor die.

3. The semiconductor package of claim 1, wherein the semiconductor package comprises a direct layer and lamination package.

4. The semiconductor package of claim 1, wherein the thickness of the mold layer has an aspect ratio of at least approximately 2 with respect to a thickness the substrate.

5. The semiconductor package of claim 1, wherein the mold layer is over-molded with respect to the at least one semiconductor die.

6. The semiconductor package of claim 1, wherein the mold layer is formed on the substrate prior to formation of the metal layer.

7. A system comprising:

a semiconductor package having an interior portion defined by a substrate and a cover, the semiconductor package including a semiconductor die coupled to the substrate, a metal layer formed on a backside of the semiconductor die, and a compound molded onto an exposed portion of the substrate within the interior portion, wherein a top surface of the metal layer and a top surface of the compound are substantially coplanar to reduce warpage of the semiconductor package, and a thickness of the metal layer is at least approximately twice a thickness of the substrate and the metal layer thickness is between approximately 0.5 and 1.0 times a thickness of the semiconductor die; and a circuit board to support the semiconductor package.

8. The system of claim 7, wherein the metal layer is in substantial contact with the cover.

9. The system of claim 7, further comprising a thermal interface material sandwiched between the metal layer and the cover.

10. The system of claim 7, wherein the metal layer is to transfer heat from the semiconductor die to the cover of the semiconductor package.

11. The system of claim 7, wherein the compound is formed on the substrate prior to formation of the metal layer.

12. A semiconductor package comprising:

a substrate;

at least one semiconductor die having a first surface opposing the substrate and a second surface;

an underfill layer coupled between the at least one semiconductor die and the substrate;

a metal layer formed on the second surface of the at least one semiconductor die;

a mold layer formed on the substrate, wherein a top of the mold layer has a thickness such that the mold layer extends above the second surface of the at least one semiconductor die and is substantially coplanar with a top of the metal layer, to reduce warpage of the semiconductor package;

a thermal heat spreader affixed to the substrate and in contact with the metal layer to dissipate heat from the at least one semiconductor die;

wherein the thickness of the mold layer has an aspect ratio of at least approximately 2 with respect to a thickness the substrate and the semiconductor package comprises a direct layer and lamination package.

13. The semiconductor package of claim 12, wherein the mold layer is over-molded with respect to the at least one semiconductor die.

* * * * *